US012644697B2

(12) United States Patent　　　　(10) Patent No.:　US 12,644,697 B2

Ertsgaard et al.　　　　　　　　　(45) Date of Patent:　　　　Jun. 2, 2026

(54) HIGH PRECISION PHOTONIC ALIGNMENT DEVICE

(71) Applicant: Quantinuum LLC, Broomfield, CO (US)

(72) Inventors: Christopher Ertsgaard, Broomfield, CO (US); Molly Krogstad, Broomfield, CO (US); Robert D. Horning, Broomfield, CO (US)

(73) Assignee: QUANTINUUM LLC, Broomfield, CO (US)

( * ) Notice:　Subject to any disclaimer, the term of this patent is extended or adjusted under 35 U.S.C. 154(b) by 370 days.

(21) Appl. No.: 18/193,960

(22) Filed:　Mar. 31, 2023

(65)　　　　　Prior Publication Data

US 2023/0375336 A1　Nov. 23, 2023

Related U.S. Application Data

(60) Provisional application No. 63/364,966, filed on May 19, 2022.

(51) Int. Cl.
　　*G01B 11/27*　　　　(2006.01)
　　*G03F 7/00*　　　　(2006.01)
(52) U.S. Cl.
　　CPC ..........　*G01B 11/272* (2013.01); *G03F 7/0005* (2013.01); *G03F 7/70383* (2013.01)
(58) Field of Classification Search
　　CPC .. G01B 11/272; G03F 7/0005; G03F 7/70383
　　See application file for complete search history.

(56)　　　　　References Cited

U.S. PATENT DOCUMENTS 5,850,498 A * 12/1998 Shacklette ........... G02B 6/1221
　　　　　　　　　　　　　　　　　　　385/129
6,563,998 B1 * 5/2003 Farah ................... G02B 6/3636
　　　　　　　　　　　　　　　　　　　385/131
(Continued)

FOREIGN PATENT DOCUMENTS

CN　　114026479 A　　2/2022
EP　　　3822697 A1 * 5/2021 ............. G02B 6/136
(Continued)

OTHER PUBLICATIONS

Huang et al., Hybrid Integration of End-to-End Optical Interconnects on Printed Circuit Boards, IEEE Transactions on Components and Packaging Technologies, vol. 30, No. 4, Dec. 2007 (Year: 2007).*

(Continued)

*Primary Examiner* — Peter Radkowski

(74) *Attorney, Agent, or Firm* — ALSTON & BIRD LLP

(57)　　　　　ABSTRACT

Various embodiments provide alignment devices and methods of manufacturing and methods of using alignment devices. In an example embodiment, an alignment device includes a first substrate comprising inputs at respective input positions, outputs at respective output positions, and waveguides configured to provide optical paths from respective inputs to respective outputs. The respective input positions are fabricated in accordance with an input position array determined based on measured positions of optical fiber cores of optical fibers secured to a coupling element array. The coupling element array comprises a plurality of coupling elements having a respective one of the optical fibers secured therein. Each optical fiber is associated with a respective input and the input position array indicates the position of each respective input. The respective output
(Continued)

positions are configured to provide respective optical signals to the respective target locations of the receiving device.

7 Claims, 8 Drawing Sheets

(56) References Cited

U.S. PATENT DOCUMENTS

| | | | | |
|---|---|---|---|---|
| 6,793,409 | B2 * | 9/2004 | Wickman | G02B 6/423 |
| | | | | 385/88 |
| 11,231,549 | B2 * | 1/2022 | Belt | G02B 6/1228 |
| 11,874,498 | B2 * | 1/2024 | Belt | G02B 6/1228 |
| 11,892,744 | B2 * | 2/2024 | Rowe | G06E 3/005 |
| 2002/0110328 | A1 * | 8/2002 | Bischel | G02B 6/4201 |
| | | | | 385/27 |
| 2003/0147600 | A1 * | 8/2003 | Wickman | G02B 6/423 |
| | | | | 385/88 |
| 2016/0202432 | A1 * | 7/2016 | Chen | G02B 6/4227 |
| | | | | 385/14 |
| 2020/0200971 | A1 * | 6/2020 | Wohlfeil | G02B 6/4225 |
| 2020/0218009 | A1 * | 7/2020 | Preston | G01N 21/648 |
| 2020/0278508 | A1 | 9/2020 | Israel et al. | |
| 2021/0149112 | A1 * | 5/2021 | Belt | G02B 6/136 |
| 2021/0373232 | A1 | 12/2021 | Ishikawa et al. | |
| 2021/0389522 | A1 * | 12/2021 | Rowe | G02F 1/292 |
| 2022/0107460 | A1 * | 4/2022 | Belt | G02B 6/136 |
| 2022/0244474 | A1 | 8/2022 | Shastri et al. | |
| 2022/0327414 | A1 | 10/2022 | Bohn et al. | |
| 2024/0126135 | A1 * | 4/2024 | Rowe | G02F 1/292 |

FOREIGN PATENT DOCUMENTS

| | | | | | |
|---|---|---|---|---|---|
| EP | 3923048 | A1 * | 12/2021 | | G06E 3/005 |
| JP | 2015055788 | A * | 3/2015 | | |
| JP | 2020-091303 | A | 6/2020 | | |
| TW | 202041847 | A | 11/2020 | | |
| WO | WO-2020257080 | A1 * | 12/2020 | | G02B 6/136 |
| WO | 2022/090729 | A1 | 5/2022 | | |

OTHER PUBLICATIONS

Srisanit et al., Laser writing of low-loss polymer channel waveguides. 10.1109/CLEO.2002.1033894. (Year: 2002).*

Srisanit et al., Non-lithographic fabrication of polymer reconfigurable waveguide fanout. Proceedings of SPIE—The International Society for Optical Engineering. 5728. 10.1117/12.590872. (Year: 2005).*

Srisanit et al., Laser writing correction of polymer waveguide fanouts, Optics Communications, vol. 244, Issues 1-6, 2005, pp. 171-179, ISSN 0030-4018, https://doi.org/10.1016/j.optcom.2004.09.042. (https://www.sciencedirect.com/science/article/pii/S0030401804009381) (Year: 2005).*

English language tgext of JP-2015055788-A (Year: 2015).*

Desmet et al., Laser Written Glass Interposer for Fiber Coupling to Silicon Photonic Integrated Circuits, in IEEE Photonics Journal, vol. 13, No. 1, pp. 1-12, Feb. 2021, doi: 10.1109/JPHOT.2020.3039900. (Year: 2021).*

Thomson et al., Ultrafast-laser inscription of a three dimensional fan-out device for multicore fiber coupling applications, Opt. Express 15, 11691-11697 (2007) (Year: 2007).*

Watanabe et al., Stacked polymer waveguide type fan-in/fan-out device for dense multi-core fibre. 2015, IET Optoelectron., 9: 158-162. https://doi.org/10.1049/iet-opt.2014.0137 (Year: 2015).*

EP Office Action Mailed on Jul. 3, 2025 for EP Application No. 23174166, 11 page(s).

English translation of TW Notice of Allowance dated Aug. 13, 2024 for TW Application No. 112118661, 6 page(s).

TW Notice of Allowance Mailed on Aug. 13, 2024 for TW Application No. 112118661, 6 page(s).

English Translation of JP Office Action dated Feb. 19, 2024 for JP Application No. 2023082416, 3 page(s).

English Translation of TW Office Action, including Search Report, dated Jan. 10, 2024 for TW Application No. 112118661, 8 page(s).

Extended European Search Report Mailed on Oct. 11, 2023 for EP Application No. 23174166, 11 page(s).

JP Office Action Mailed on Feb. 19, 2024 for JP Application No. 2023082416, 3 page(s).

TW Office Action, including Search Report, Mailed on Jan. 10, 2024 for TW Application No. 112118661, 8 page(s).

English translation of JP Decision to Grant dated Jun. 3, 2024 for JP Application No. 2023082416, 2 page(s).

JP Decision to Grant Mailed on Jun. 3, 2024 for JP Application No. 2023082416, 3 page(s).

CN Office Action, including Search Report Mailed on Dec. 20, 2025 for CN Application No. 202310570717, 7 page(s).

English Translation of CN Office Action, including Search Report dated Dec. 20, 2025 for CN Application No. 202310570717, 10 page(s).

* cited by examiner

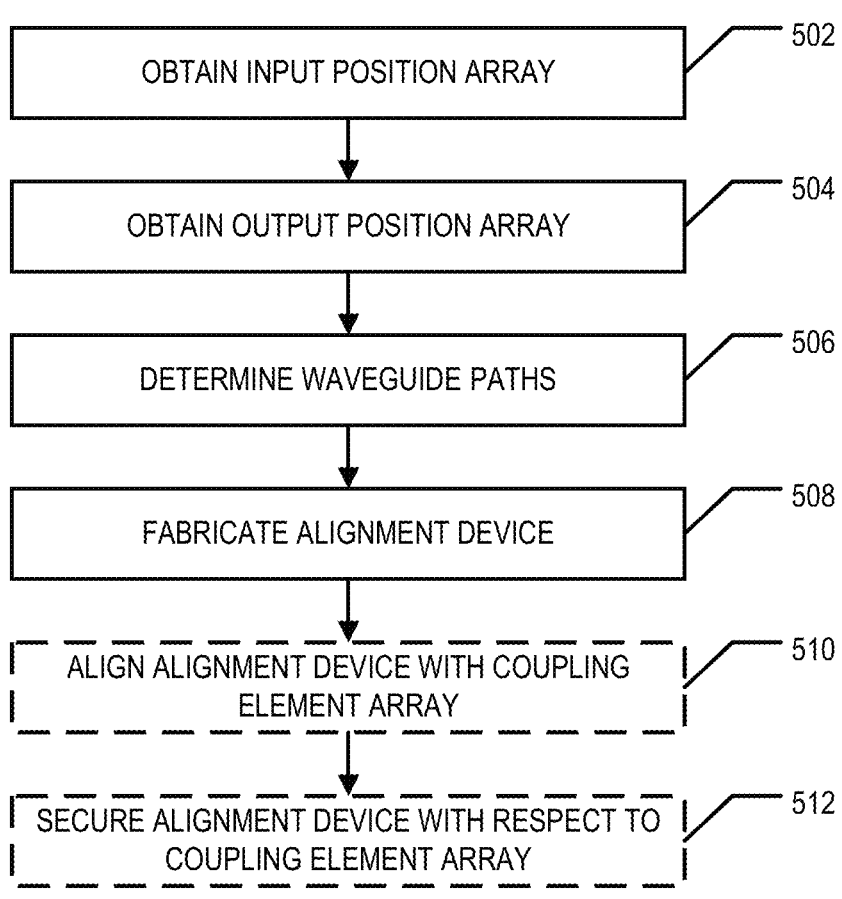

OBTAIN INPUT POSITION ARRAY — 502

OBTAIN OUTPUT POSITION ARRAY — 504

DETERMINE WAVEGUIDE PATHS — 506

FABRICATE ALIGNMENT DEVICE — 508

ALIGN ALIGNMENT DEVICE WITH COUPLING ELEMENT ARRAY — 510

SECURE ALIGNMENT DEVICE WITH RESPECT TO COUPLING ELEMENT ARRAY — 512

FIG. 5

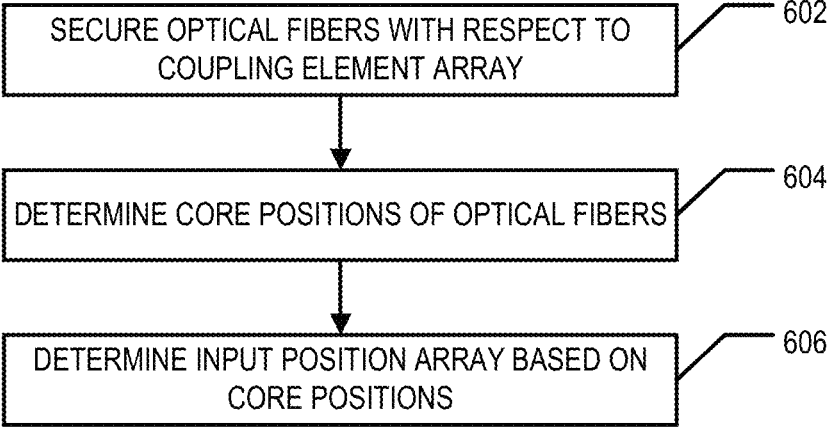

SECURE OPTICAL FIBERS WITH RESPECT TO COUPLING ELEMENT ARRAY — 602

DETERMINE CORE POSITIONS OF OPTICAL FIBERS — 604

DETERMINE INPUT POSITION ARRAY BASED ON CORE POSITIONS — 606

FIG. 6

HIGH PRECISION PHOTONIC ALIGNMENT DEVICE

CROSS-REFERENCE TO RELATED APPLICATIONS

This application claims priority to U.S. Application No. 63/364,966, filed May 19, 2022, the content of which is incorporated by reference herein in its entirety.

TECHNICAL FIELD

Various embodiments relate to high precision photonic alignment devices, systems incorporating photonic alignment devices, methods of manufacturing photonic alignment devices, and/or methods of use of photonic alignment devices. An example embodiment relates to the providing of a plurality of optical beams to target locations of a receiving a device, such an atomic object confinement apparatus of a quantum charge coupled device (QCCD)-based quantum computer.

BACKGROUND

Conventionally, v-groove arrays are used to optically couple optical fibers to receiving devices. Such configurations result in alignment errors of a micron or more. Through applied effort, ingenuity, and innovation many deficiencies of prior optical path alignment techniques have been solved by developing solutions that are structured in accordance with the embodiments of the present invention, many examples of which are described in detail herein.

BRIEF SUMMARY OF EXAMPLE EMBODIMENTS

Example embodiments provide high precision photonic alignment devices, systems incorporating photonic alignment devices, methods of manufacturing photonic alignment devices, and/or methods of use of photonic alignment devices. In various embodiments, the photonic alignment devices are configured to enable alignment of a plurality of optical fibers with respective target locations of a receiving device with precision within the range of 10 to 500 nm. In various embodiments, the plurality of optical fibers are secured into a coupling element array, such as a v-groove array and/or the like. The photonic alignment device is configured (e.g., designed and fabricated) to provide high precision alignment between the plurality of optical fibers secured into the coupling element array and the target locations of the receiving device.

Various embodiments provide alignment devices and methods of manufacturing and methods of using alignment devices. In an example embodiment, an alignment device includes a first substrate comprising inputs at respective input positions, outputs at respective output positions, and waveguides configured to provide optical paths from respective inputs to respective outputs. The respective input positions are fabricated in accordance with an input position array determined based on measured positions of optical fiber cores of optical fibers secured to a coupling element array. The coupling element array comprises a plurality of coupling elements having a respective one of the optical fibers secured therein. Each optical fiber is associated with a respective input and the input position array indicates the position of each respective input. The respective output positions are configured to provide respective optical signals to the respective target locations of the receiving device.

According to an aspect of the present disclosure, a method for manufacturing an alignment device is provided. In an example embodiment, the method comprises obtaining an input position array based on a coupling element array and optical fibers secured to coupling element array, wherein the coupling element array comprises a plurality of coupling elements having a respective one of the optical fibers secured therein, each optical fiber associated with a respective input and the input position array indicating the position of each respective input; obtaining an output position array based at least in part on a plurality of target locations of a receiving device; determining one or more waveguide paths, each waveguide path configured to provide an optical path between one or more respective input positions of the input position array to one or more respective output positions of the output position array; and fabricating the alignment device such that the alignment device comprises a substrate comprising a plurality of inputs at respective input positions corresponding to the input position array, a plurality of outputs at respective output positions corresponding to the output position array, and one or more waveguides corresponding to the one or more waveguide paths.

In an example embodiment, fabricating the alignment device comprises using a lithographic technique to form at least one of the plurality of inputs, the plurality of outputs, or the one or more waveguides.

In an example embodiment, the lithographic technique is one of an ebeam lithographic technique or a direct-write lithographic technique.

In an example embodiment, the input position array is determined based at least in part on a measurement of the positions of optical fiber cores of the optical fibers secured to coupling element array.

In an example embodiment, the method further comprises aligning the alignment device with the coupling element array based at least in part on at least one array alignment element of the coupling element array and at least one device alignment element of the alignment device and securing the alignment device into position with respect to the coupling element array.

In an example embodiment, the output position array is determined based at least in part on a determination of the target locations of the receiving device.

In an example embodiment, the output position is determined based at least in part on one or more output properties associated with respective outputs of the plurality of outputs.

In an example embodiment, the method further comprises fabricating or positioning one or more optical elements along at least one of the one or more waveguides and/or at at least one output of the plurality of outputs.

According to an aspect of the present disclosure, a method for aligning one or more optical sources with respective target locations of a receiving device is provided. The method comprises providing an alignment device, the alignment device comprising a first substrate comprising a plurality of inputs at respective input positions, a plurality of outputs at respective output positions, and one or more waveguides configured to provide optical paths from one or more respective inputs of the plurality of inputs to one or more respective outputs of the plurality of outputs. The respective input positions are configured to correspond to optical fiber cores of optical fibers secured to a coupling element array. The coupling element array comprises a plurality of coupling elements having a respective one of the optical fibers secured therein, each optical fiber associated with a respective input and the input position array indicating the position of each respective input. The respective output positions are configured to provide respective optical signals to the respective target locations of the receiving device. The alignment device is secured into position with respect to the coupling element array by aligning the first substrate with a second substrate, where the coupling element array formed on the second substrate. The method further comprises securing the alignment device with respect to the receiving device such that an alignment criteria is satisfied.

In an example embodiment, the method further comprises, at a point in time after the securing of the alignment device with respect to the receiving device (e.g., in response to an alignment check trigger being identified by a controller of the system), determining whether the alignment criteria is still satisfied.

In an example embodiment, the method further comprises when it is determined that the alignment criteria is not still satisfied, performing an alignment correction; and when it is determined that the alignment criteria is still satisfied, not moving the alignment device with respect to the receiving device.

In an example embodiment, the alignment device is mounted to a mechanical assembly that is configured to be controlled to perform the alignment correction.

In an example embodiment, the mechanical assembly comprises a piezoelectric element (e.g., a piezoelectric inchworm motor, piezoelectric transducer, piezoelectric actuator, and/or the like associated with one or more degrees of freedom).

In an example embodiment, the alignment device is epoxied to the coupling element array.

In an example embodiment, each of the optical fiber cores of optical fibers is secured into position with respect to the respective input with sub-micron precision.

In an example embodiment, at least one of the plurality of inputs, the plurality of outputs, or the one or more waveguides is fabricated using at least one of an ebeam lithographic technique or a direct-write lithographic technique.

According to another aspect, an alignment assembly is provided. In an example embodiment, the alignment assembly comprises an alignment device comprising a first substrate comprising a plurality of inputs at respective input positions, a plurality of outputs at respective output positions, and one or more waveguides configured to provide optical paths from one or more respective inputs of the plurality of inputs to one or more respective outputs of the plurality of outputs. The respective input positions are fabricated in accordance with an input position array determined based on measured positions of optical fiber cores of optical fibers secured to a coupling element array. The coupling element array comprises a plurality of coupling elements having a respective one of the optical fibers secured therein, each optical fiber associated with a respective input and the input position array indicating the position of each respective input. The respective output positions are configured to provide respective optical signals to the respective target locations of the receiving device. The alignment assembly further comprises a coupling element array, where the alignment device is secured into position with respect to the coupling element array by aligning the first substrate with a second substrate. The coupling element array is formed on the second substrate.

In an example embodiment, the alignment assembly further comprises one or more output optical elements, each output optical element disposed at or near a respective output of the plurality of outputs and configured to cause a respective optical signal exiting the respective output to be imparted with output properties.

In an example embodiment, the alignment assembly further comprises at least one of (a) one or more beam splitters or (b) one or more modulators associated with respective waveguides of the one or more waveguides.

In an example embodiment, the alignment device is fabricated at least in part using at least one of an ebeam lithographic technique or a direct-write lithographic technique.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 5 is a flowchart illustrating various processes, procedures, and/or operations for manufacturing an alignment device, according to an example embodiment.

FIG. 6 is a flowchart illustrating various processes, procedures, and/or operations for determining an input position array, according to an example embodiment.

Figure 9:
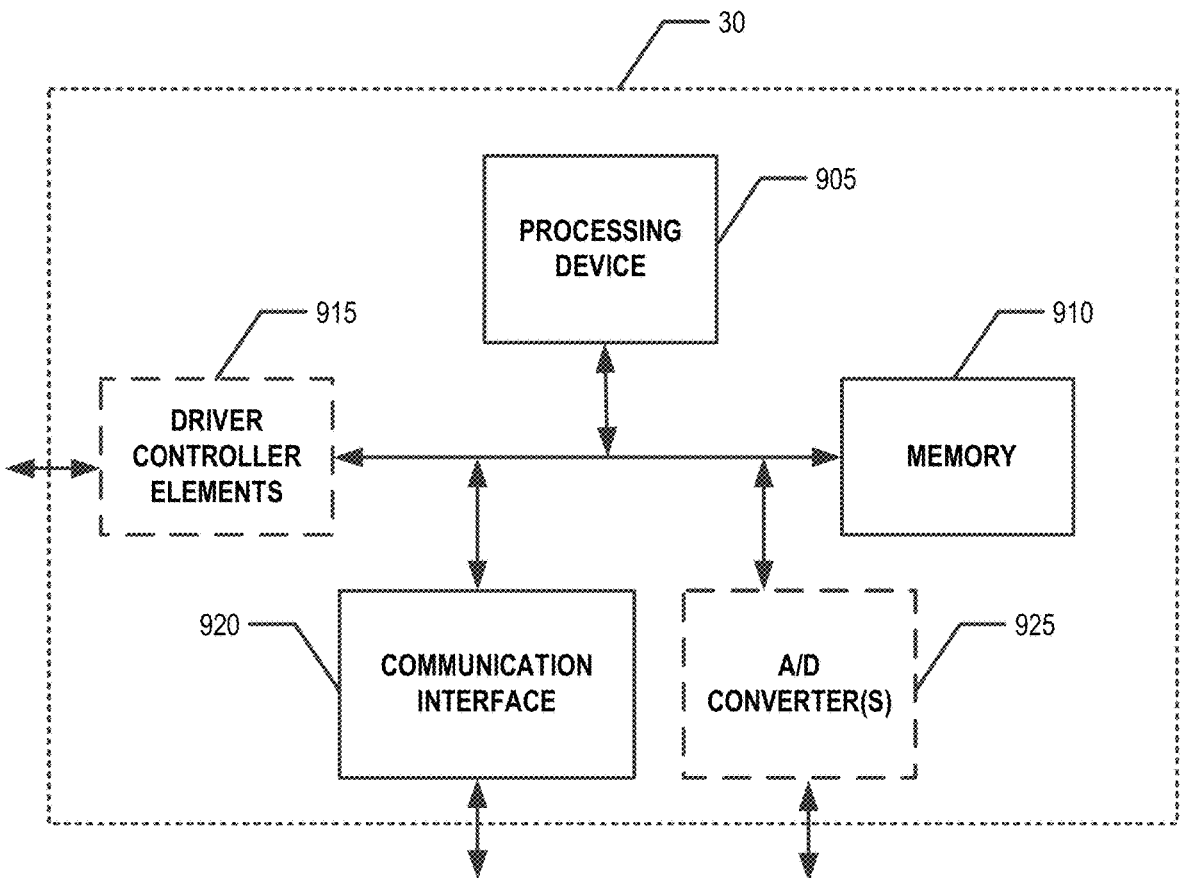

FIG. 9 provides a schematic diagram of an example controller of a quantum computer configured to perform one or more deterministic reshaping and/or reordering functions, according to various embodiments.

Figure 10:
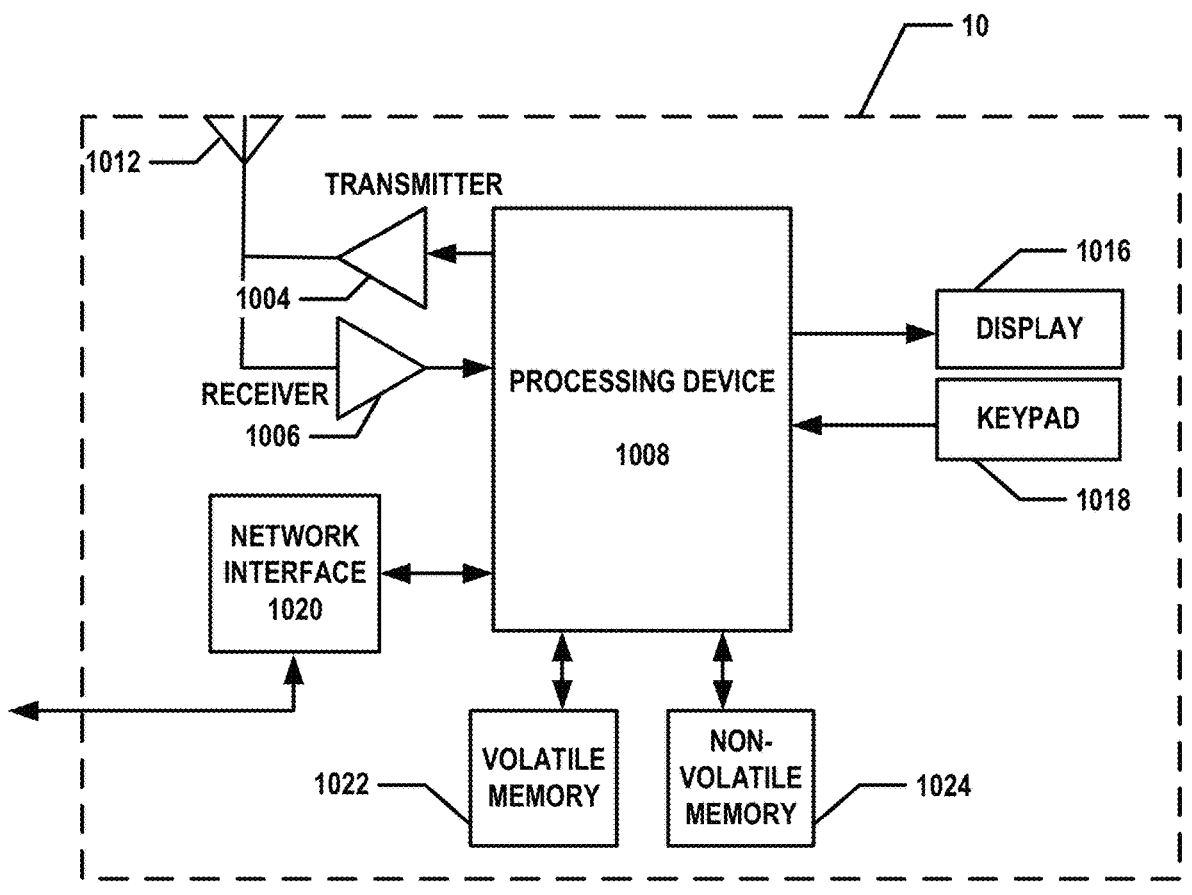

FIG. 10 provides a schematic diagram of an example computing entity of a quantum computer system that may be used in accordance with an example embodiment.

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally," "substantially," and "approximately" refer to within engineering and/or manufacturing tolerances and/or within user measurement capabilities, unless otherwise indicated. Like numbers refer to like elements throughout.

Example embodiments provide high precision photonic alignment devices, systems incorporating photonic alignment devices, methods of manufacturing photonic alignment devices, and/or methods of use of photonic alignment devices. In various embodiments, the photonic alignment devices are configured to enable alignment of a plurality of optical fibers with respective target locations of a receiving device with precision within the range of 10 to 500 nm. In various embodiments, the plurality of optical fibers are secured into a coupling element array, such as a v-groove array and/or the like. The photonic alignment device is configured (e.g., designed and fabricated) to provide high precision alignment between the plurality of optical fibers secured into the coupling element array and the target locations of the receiving device.

Conventionally, v-groove arrays are used to optically couple optical fibers to receiving devices. Such configurations result in alignment errors on the order of a micron or more. While such alignment errors may not substantially degrade performance at longer wavelengths (e.g., infrared wavelengths or longer), such alignment errors are detrimental at visible and UV wavelengths. For example, visible and UV wavelengths have lower coupling efficiency due to the generally smaller mode field diameters of the shorter wavelength light. Moreover, for cryogenic and/or in-cryostat applications, shifts in alignment positioning during the thermal cycling of the system to reduce the system to cryogenic temperatures can cause further alignment errors. To overcome such alignment errors, higher levels of optical power are often used, resulting in unwanted heating within the cryostat and reduced lifetime due to fiber and waveguide degradation.

In an attempt to reduce the excess optical power required to be delivered to the system, silicon v-groove arrays which offer microscopic fiber alignment with matched coefficients of thermal expansion are used to mitigate these high edge coupling losses. Despite the v-groove precision, core/cladding concentricity of the optical fibers is still limited and results in typical errors of the core pitch and vertical position (e.g., typically ~1 μm). While acceptable at longer wavelengths (e.g., infrared), this results in significant input coupling loss at the visible/UV wavelengths. Additionally, the fiber pitch on these v-groove arrays is at best >100 μm which quickly consumes chip edge-space. This limits the number of fibers that can be coupled to a chip (a significant challenge as future devices are scaled up to double- or triple-digit fiber count) and competes with wire-bond space needed for scaling up the number of electrodes on the chip.

Moreover, to mitigate thermal drift and maintain alignment during bake-out and cryogenic pumping, these v-groove arrays must also be epoxied to the photonic integrated circuits (PICs). This poses a significant challenge when scaling toward commercial operation. Optical fiber alignment takes considerable technician time (especially as the number of coupled fibers grows into double digits) and requires active alignment during the entire curing process. Any misalignment or re-working of the optical fibers will require both the fiber array and the entire PIC assembly to be disposed of—starting the entire process over. Likewise, if alignment shifts during thermal cycling, again the entire PIC assembly and v-groove array must be disposed, resulting in a trial by error down selection of cherry-picking the PIC-v-groove assembly that successfully remains aligned through the entire thermal cycle. Further, under commercial operation the system is expected to run for multiple months at a minimum. With the fiber v-groove array epoxied to the PIC assembly, fiber lifetime will likely be limited and replaceability will again require the entire PIC assembly to be disposed of and the down-selection process repeated. These issues only get exacerbated as the number of fibers required increases. Thus, significant technician and engineer time and waste of PIC assembly are expected.

Significant problems therefore exist regarding the alignment of optical fibers being coupled to PIC assemblies. These problems are particularly salient in systems using visible and/or UV wavelength optical signals and systems where the PIC assembly is operated within a cryostat and/or at reduced temperatures (e.g., less than ambient and/or room temperature) and/or in high vacuum compatible environments.

Various embodiments provide technical solutions to these technical problems regarding the alignment of optical fibers coupled to PIC assemblies. In various embodiments, an alignment device is provided that is configured to receive respective optical signals from an array of optical fibers that are secured within a coupling element array. For example, an array of input positions for the alignment device is determined based on the actual core positions of the array of optical fibers that are secured within the coupling element array. The alignment device is configured to provide respective optical signals to respective target locations of a receiving device (e.g., the PIC assembly). For example, the array of output positions for the alignment device is determined based on the actual target location positions of the receiving device. The alignment device may then be secured into alignment with respect to the array of coupling elements and the optical fiber array. For example, an epoxying process may be used to secure the alignment device into an appropriate alignment with the array of coupling elements. A mechanical alignment assembly may be used to provide sub-micron positional control of the alignment device such that any positional and/or alignment changes during thermal cycling can be corrected to provide proper alignment of the alignment device to the PIC assembly during system operation.

Moreover, when an optical fiber needs to be replaced, only the alignment device and the coupling element array need to be replaced along with the array of optical fibers. In other words, the PIC assembly need not be replaced and/or removed from the cryostat. As the alignment device is a substantially simpler device than the PIC assembly, the time and resources required for fabricating a new alignment device are low compared to fabricating a new PIC assembly. Furthermore, in various embodiments the PIC assembly is required to be installed within the cryostat in a particular manner (e.g., level to within a very small error, etc.). Being able to leave the PIC assembly in position within the cryostat and replacing the alignment device enables shorter downtime for the system when dealing with burnt out optical fibers and/or the like. For example, in an example embodiment, the alignment device is a photonic fuse that acts as a comparatively easily replaced component configured to act as an intermediary between the receiving device (e.g., a PIC assembly such as an atomic object confinement apparatus) and the high-powered optical (e.g., manipulation) sources (e.g., lasers).

Various embodiments, therefore, provide significant advantages over traditional techniques for providing optical signals to a PIC assembly. Various embodiments will now be described in further detail with respect to an example where the PIC assembly is an atomic object confinement apparatus (e.g., an ion trap) and the system is a QCCD-based quantum computer. As should be understood, various aspects described herein may be used in various other systems and/or with various other PIC assemblies (e.g., in particular systems using visible/UV wavelength optical signals and/or operating within a cryostat).

Figure 1:
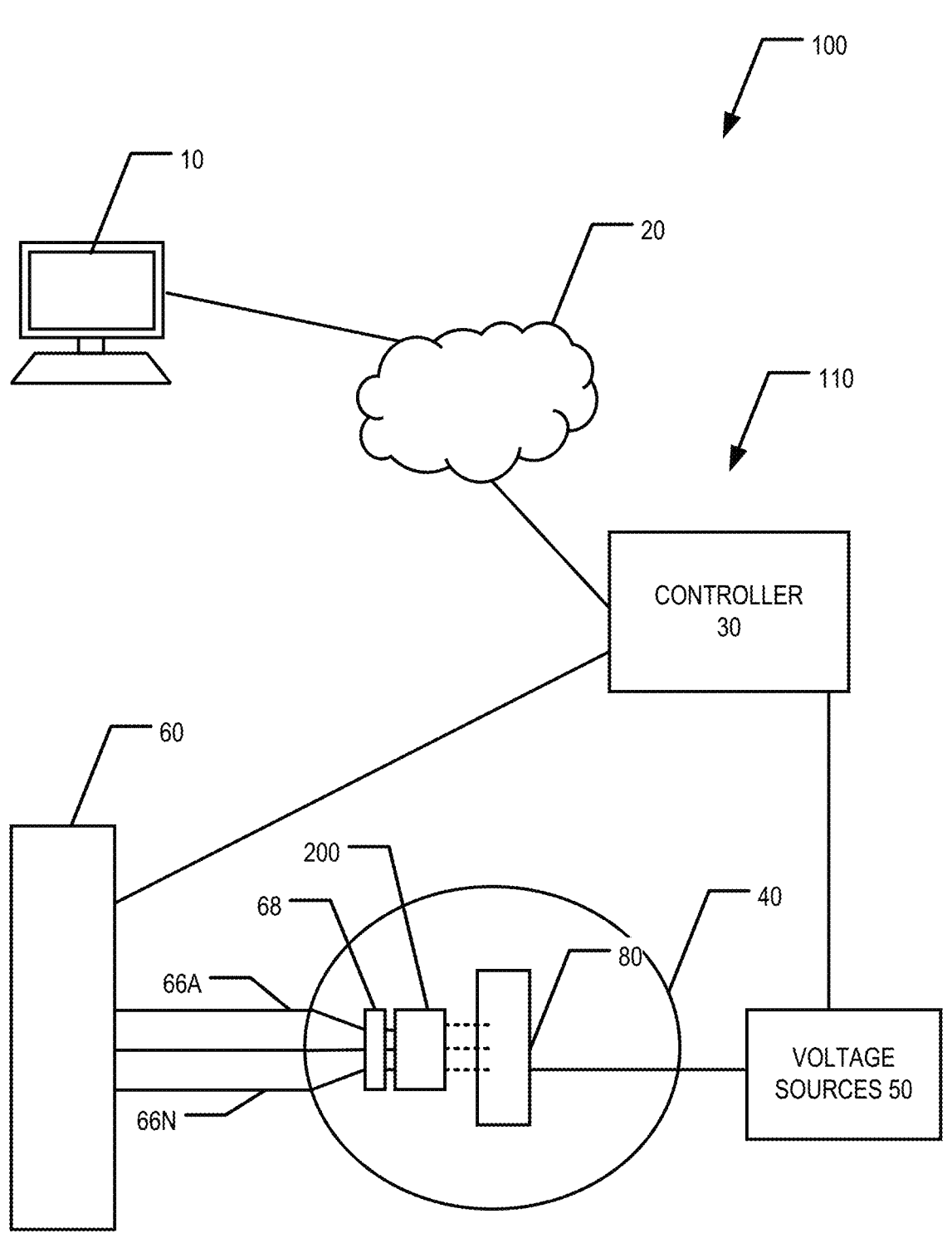
FIG. 1 is a schematic diagram illustrating an example quantum computing system using an alignment device to provide high precision alignment of optical paths to the receiving device embodied as an atomic object confinement apparatus, according to an example embodiment.

Example Quantum Computing System Comprising an Atomic Object Confinement Apparatus FIG. 1 provides a schematic diagram of an example quantum computing system 100 comprising an atomic object confinement apparatus 80 (e.g., an ion trap and/or the like), in accordance with an example embodiment. One or more manipulation sources 60 are configured to generate and/or provide manipulation signals (e.g., optical signals) such that the optical signals are incident on target locations of the receiving device, which is the PIC assembly. In this example system, the receiving device is the atomic object confinement apparatus 80. In this example system, the manipulation sources 60 are lasers and/or optical systems comprising lasers such that the manipulation signals are laser beams/pulses and/or laser beams/pulses that have been optically conditioned (e.g., to have a particular beam size at a particular location, to contain a primary signal and a particular sideband, and/or the like).

In the illustrated embodiment, the manipulation signals generated by the manipulation sources are coupled into optical fibers 66 (e.g., 66A-66N). The optical fibers 66 are secured into a coupling element array 68. In an example embodiment, the coupling element array 68 is a v-groove array formed on a second substrate (e.g., a silicon substrate and/or the like). The coupling element array 68 is secured with respect to an alignment device 200. The alignment device 200 is configured to receive optical signals from the optical fibers 66 secured into the coupling element array 68 with high coupling efficiency (e.g., with alignment errors between the optical fiber cores and the inputs of the alignment device that are less than one micron). The alignment device 200 is further configured to provide respective optical signals to respective target locations of the receiving device (e.g., the atomic object confinement apparatus 80).

In various embodiments, the quantum computing system 100 comprises a computing entity 10 and a quantum computer 110. In various embodiments, the quantum computer 110 comprises a controller 30, a cryostat and/or vacuum chamber 40 enclosing an atomic object confinement apparatus 80 (e.g., an ion trap), and one or more manipulation sources 60. For example, the cryostat and/or vacuum chamber 40 may be a pressure-controlled chamber. In an example embodiment, the manipulation signals generated by the manipulation sources 60 are provided to the interior of the cryostat and/or vacuum chamber 40 (where the atomic object confinement apparatus 80 is located) via corresponding optical paths (e.g., optical fibers 66).

In an example embodiment, the one or more manipulation sources 60 may comprise one or more lasers (e.g., optical lasers, microwave sources, and/or the like). In various embodiments, each manipulation source is configured to generate a respective manipulation signal having a respective characteristic wavelength in the microwave, infrared, visible, or ultraviolet portion of the electromagnetic spectrum. In various embodiments, the one or more manipulation sources 60 are configured to manipulate and/or cause a controlled quantum state evolution of one or more atomic objects (e.g., ions, atoms, neutral and/or ionic molecules, and/or the like) within the confinement apparatus 80 (e.g., an ion trap and/or the like). For example, in an example embodiment, wherein the one or more manipulation sources 60 comprise one or more lasers, the lasers may provide one or more laser beams to atomic objects trapped by the confinement apparatus 80 within the cryostat and/or vacuum chamber 40.

For example, the manipulation sources 60 may be configured to generate one or more manipulation signals that may be used to initialize an atomic object into a state of a defined qubit space such that the atomic object may be used as a qubit of the confined atomic object quantum computer, perform one or more gates on one or more qubits of the confined atomic object quantum computer, read and/or determine a state of one or more qubits of the confined atomic object quantum computer, and/or the like.

In various embodiments, the quantum computer 110 comprises an optics collection system configured to collect and/or detect photons generated by qubits (e.g., during reading procedures). The optics collection system may comprise one or more optical elements (e.g., lenses, mirrors, waveguides, fiber optics cables, and/or the like) and one or more photodetectors. In various embodiments, the photodetectors may be photodiodes, photomultipliers, charge-coupled device (CCD) sensors, complementary metal oxide semiconductor (CMOS) sensors, Micro-Electro-Mechanical Systems (MEMS) sensors, and/or other photodetectors that are sensitive to light at an expected fluorescence wavelength of the qubits of the quantum computer. In various embodiments, the detectors may be in electronic communication with the controller 30 via one or more A/D converters 925 (see FIG. 9) and/or the like. For example, an atomic object being read and/or having its quantum state determined may emit an emitted signal, at least a portion of which is captured by the optics collection system.

In various embodiments, the quantum computer 110 comprises one or more voltage sources 50. For example, the voltage sources 50 may comprise a plurality of voltage drivers and/or voltage sources and/or at least one RF driver and/or voltage source. The voltage sources 50 may be electrically coupled to the corresponding potential generating elements (e.g., electrodes) of the confinement apparatus 80, in an example embodiment.

In various embodiments, a computing entity 10 is configured to allow a user to provide input to the quantum computer 110 (e.g., via a user interface of the computing entity 10) and receive, view, and/or the like output from the quantum computer 110. The computing entity 10 may be in communication with the controller 30 of the quantum computer 110 via one or more wired or wireless networks 20 and/or via direct wired and/or wireless communications. In an example embodiment, the computing entity 10 may translate, configure, format, and/or the like information/data, quantum computing algorithms and/or circuits, and/or the like into a computing language, executable instructions, command sets, and/or the like that the controller 30 can understand and/or implement.

In various embodiments, the controller 30 is configured to control the voltage sources 50, cryostat system and/or vacuum system controlling the temperature and pressure within the cryostat and/or vacuum chamber 40, mechanical assembly system 250 (see FIG. 2B), manipulation sources 60, optics collection system, and/or other systems controlling various environmental conditions (e.g., temperature, pressure, magnetic field, and/or the like) within the cryostat and/or vacuum chamber 40 and/or configured to manipulate and/or cause a controlled evolution of quantum states of one or more atomic objects within the confinement apparatus. For example, the controller 30 may cause a controlled evolution of quantum states of one or more atomic objects within the confinement apparatus to execute a quantum circuit and/or algorithm. For example, the controller 30 may cause a reading procedure comprising coherent shelving to be performed, possibly as part of executing a quantum circuit and/or algorithm. In various embodiments, the atomic objects confined within the confinement apparatus are used as qubits of the quantum computer 110.

Example Alignment Device

Figure 2A:
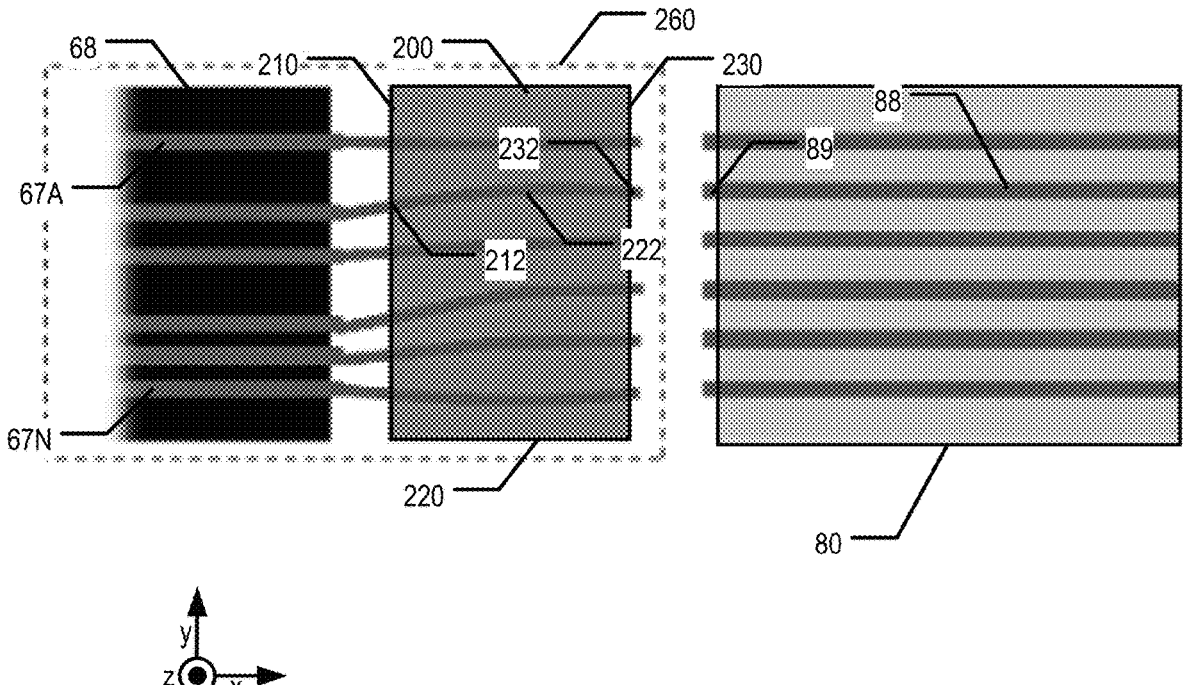
FIG. 2A is a schematic diagram of a portion of a system using an alignment device to provide high precision alignment between a plurality of optical fibers secured into a coupling element array and target locations of a receiving device, according to an example embodiment.
Figure 2B:
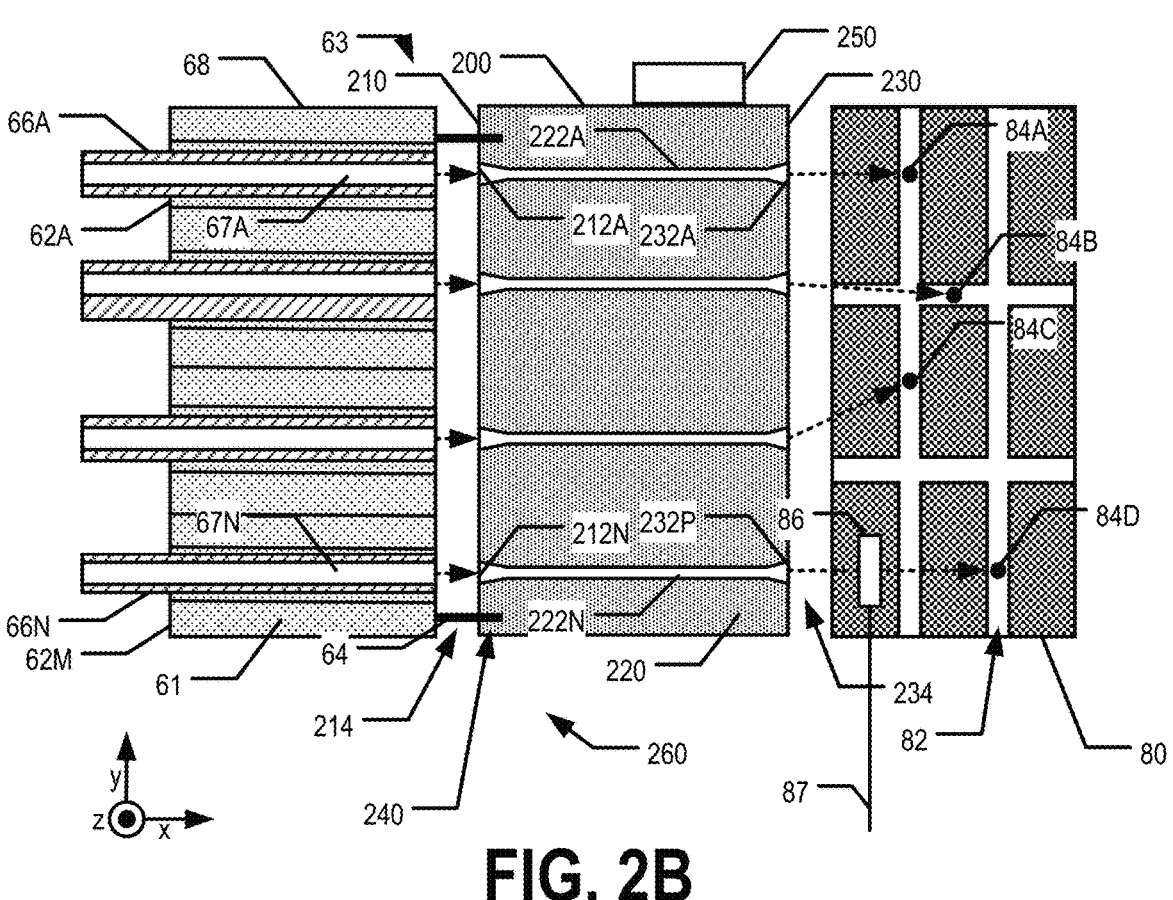
FIG. 2B is another schematic diagram of a portion of a system using an alignment device to provide high precision alignment between a plurality of optical fibers secured into a coupling element array and target locations of a receiving device, according to an example embodiment.

FIGS. 2A and 2B each provide a schematic top view of an example alignment device 200. In various embodiments, the alignment device 200 comprises a first substrate 220 having an input side 210 and an output side 230. In various embodiments, a plurality of inputs 212 (e.g., 212A-212N) are disposed on the input side 210 of the first substrate 220. In various embodiments, inputs 212 of the plurality of inputs may be disposed on multiple sides and/or surfaces of the first substrate 220. In various embodiments, a plurality of output couplers 232 (e.g., 232A-232P) are disposed on the output side 230 of the first substrate 220. In various embodiments, an input 212 of the alignment device 200 is configured to receive an optical signal from a respective optical fiber 66. In various embodiments, an output coupler 232 of the alignment device 200 is configured to provide an optical signal to a respective target location of a receiving device (e.g., atomic object confinement apparatus 80).

In various embodiments, the inputs 212 are positioned in accordance with an array of input positions 214. The array of input positions 214 are determined based on the location of the cores 67 (e.g., 67A-67N) of the optical fibers 66 that are secured into respective coupling elements 62 (e.g., 62A-62M). For example, the coupling element array 68 comprises a second substrate 61 which defines a plurality of coupling elements 62. In an example embodiment, the plurality of coupling elements are a v-groove array.

Figure 3:
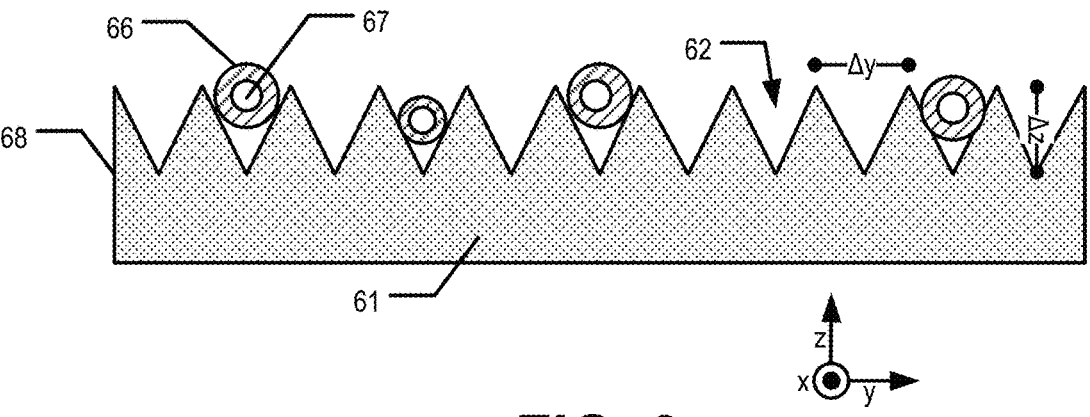
FIG. 3 is a cross-section of a coupling element array, according to an example embodiment.

FIG. 3 provides a cross-section of an example coupling element array 68 with a plurality of optical fibers 66 secured therein. For example, the illustrated coupling element array 68 is a v-groove array comprising v-grooves defined by a lateral pitch $\Delta y$ and groove depth $\Delta z$. Based on differences in the positioning of the optical fibers 66 in respective coupling elements 62 and variances between the core 67 position within the respective optical fibers 66, the positions of the cores 67 are not easily predictable at the sub-micron level.

Returning to FIGS. 2A and 2B, the output couplers 232 are positioned in accordance with an array of output positions 234. The array of output positions 234 are determined based on respective target locations 84 (e.g., 84A-84D). For example, the atomic object confinement apparatus 80 defines an array of one dimensional trapping regions 82, in an example embodiment. The array of one dimensional trapping regions 82 define a plurality of target locations 84. For example, the atomic object confinement apparatus 80 may be configured to confine one or more atomic objects at respective target locations 84 such that manipulation signals (e.g., provided via the alignment device 200) are incident on the atomic objects at the target locations 84 to perform one or more functions of the quantum computer 110. For example, an array of output couplers 232 are configured to couple manipulation signals and/or optical signals into a dense array of input waveguides 88 of the atomic object confinement apparatus 80, in an example embodiment. Thus, an optical signal exiting an output coupler 232 defined in accordance with the array of output positions 234 is configured such that the manipulation signal and/or optical signal is provided to a respective input waveguide of the array of input waveguides of the atomic object confinement apparatus 80 and caused (e.g., by the respective input waveguide) to be incident on a corresponding target location 84.

In various embodiments, the alignment device 200 comprises a plurality of waveguides 222. In various embodiments, a waveguide 222 provides an optical path from at least one input 212 to at least one output coupler 232 of the alignment device 200. For example, in an example embodiment, each input 212 is optically connected to at least one output coupler 232 via a corresponding waveguide 222.

Figure 4:
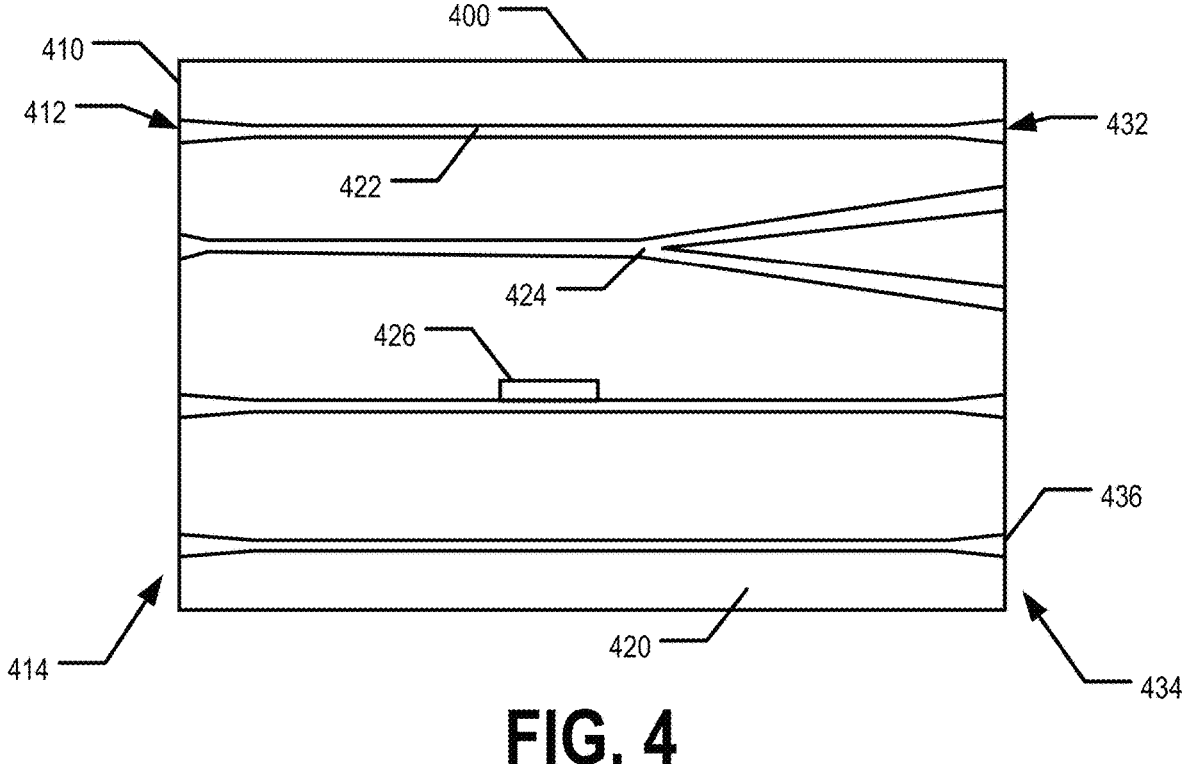
FIG. 4 is a schematic diagram of an example alignment device, according to an example embodiment.

FIG. 4 illustrates an example alignment device 400 comprising a plurality of inputs 412 on an input side 410 of a first substrate 420 that are defined and/or positioned in accordance with an array of input positions 414 and a plurality of outputs 434 on an output side 430 of the first substrate 420 that are defined and/or positioned in accordance with an array output positions 434. The inputs 412 are optically connected to respective outputs 432 via respective waveguides 422. In various embodiments, the waveguides comprise various optical elements. In various embodiments, one or more waveguides 422 comprise various optical elements such as beam splitters 424; wavelength, phase, and/or intensity modulators 426; diffractive optical elements (e.g., lenses, gratings, and/or the like); metasurface lenses; and/or the like. In an example embodiment, an output 432 comprises an output optical element 436. For example, a diffractive optical element such as a lens or grating, a metasurface lens, and/or the like may be secured and/or disposed at a respective output 432. For example, the waveguides 422 may include various beam splitters and/or optical elements to condition the optical signals propagated therethrough similar to as described by U.S. application Ser. No. 17/316, 354, filed May 16, 2021, the content of which is incorporated herein by reference in its entirety. In various embodiments, the output optical element 436 is configured to provide an optical signal exiting the respective output 432 toward and/or to the respective target location 84 (e.g., possibly via an input waveguide 88 of the atomic object confinement apparatus 80).

Returning to FIGS. 2A and 2B, in an example embodiment, the coupling element array 68 further comprises an array alignment element 64 and the alignment device comprises a device alignment element 240. The array alignment element 64 and the device alignment element 240 are configured to mate, engage, and/or otherwise be used to determine when the coupling element array 68 is aligned with the alignment device 200 (in at least one degree of freedom). For example, in the illustrated embodiment, the coupling element array 68 comprises array alignment elements 64 that are protrusions that are configured to be mated into respective device alignment elements 240 that are embodied as recesses. When an array alignment element 64 is mated, engaged, and/or the like with the corresponding device alignment element 240, the alignment device 200 and the coupling element array 68 are aligned in at least one degree of freedom (e.g., in the x-direction, y-direction, z-direction, rotation about the x-axis, and/or tilt with respect to the yz-plane, as illustrated). In an example embodiment, When an array alignment element 64 is mated, engaged, and/or the like with the corresponding device alignment element 240, the alignment device 200 and the coupling element array 68 are aligned with respect to six degrees of freedom.

In an example embodiment, a loopback waveguide (e.g., located at the edge of the coupling element array 68 and the alignment device 200) are used to optically confirm that the coupling element array 68 and the alignment device 200 are aligned. In an example embodiment, the downstream optical output is monitored (for example, via a power monitor and/or photodiode disposed on the alignment device 200 and/or atomic object confinement apparatus 80). For example, a control algorithm may be implemented (e.g., via controller 30) that is configured to input corresponding to the monitored downstream optical output and adjusts (e.g., via a piezoelectric transducer) the alignment of the coupling element array 68 and the alignment device in real time or near real time.

In an example embodiment, the coupling element array 68 is secured, adhered, and/or epoxied into alignment with the alignment device 200. For example, once the alignment device 200 is fabricated to provide sub-micron alignment of the plurality of optical fibers 66 secured into the coupling element array 68 and the target locations 84 of the receiving device (e.g., atomic object confinement apparatus 80), the alignment device 200 may be aligned with the coupling element array 68 (e.g., using the array alignment element 64 and the device alignment element 240) and secured into an aligned relationship with one another. For example, the coupling element array 68 may be epoxied to the alignment device 200 and/or otherwise secured such that the position of the coupling element array 68 with respect to the alignment device 200 is not able to change. In an example embodiment, a machined mechanical scaffold is used to hold the coupling element array 68 into alignment with the alignment device 200. In an example embodiment, photonic wirebonding may be used to align the coupling element array 68 and the alignment device 200 and/or to secure the coupling element array 68 into alignment with the alignment device 200.

In various embodiments, the coupling element array 68 and the alignment device 200 are installed into a cryostat and/or vacuum chamber 40. For example, an initial alignment of the alignment device 200 with a receiving device (e.g., atomic object confinement apparatus 80) is performed so that the output couplers 232 of the alignment device 200 are configured to provide respective optical signals to respective target locations 84 of the receiving device. A thermal cycling process may then be used to reduce the temperature within the cryostat and/or vacuum chamber 40. For example, the temperature within the cryostat and/or vacuum chamber may be reduced to a cryogenic temperature (e.g., 124 K or less such as less than 10 K in various embodiments).

At one or more points during the thermal cycling process and/or after completion of the thermal cycling process, the alignment of the alignment device 200 (e.g., the output couplers 232) with the target locations 84 of the receiving device (e.g., the atomic object confinement apparatus 80) is checked.

In an example embodiment, an optical feedback loop is used to optically confirm that the alignment device 200 and the atomic object confinement apparatus 80 are aligned. In an example embodiment, a loopback waveguide (e.g., located at the edge of the alignment device 200 and the atomic object confinement apparatus 80) are used to optically confirm that the alignment device 200 and the atomic object confinement apparatus 80 are (globally) aligned. In another example, one or more power monitors 86 may be disposed on the receiving device (e.g., the atomic object confinement apparatus 80). In an example embodiment, a power monitor 86 and/or photodiode may be positioned along the optical path between an output coupler 232 and a corresponding target location 84 and configured to pick off a portion of an optical signal being provided to the corresponding target location 84 to measure an intensity and/or power provided by the optical signal. In an example embodiment, the alignment device 200 comprises one or more output couplers 232 that are configured to provide dedicated alignment signals to respective power monitors 86 disposed on the receiving device. In an example embodiment, the one or more power monitors 86 are in electrical communication with the controller 30 via wired connections 87. In an example embodiment, an alignment arrangement, an example of which is described in U.S. application Ser. No. 17/653,979, filed Mar. 8, 2022, the content of which is incorporated herein by reference in its entirety, may be used to aid in the alignment of the alignment device 200 with the receiving device.

The controller 30 may determine, based on the signals generated by the power monitors 86, alignment corrections configured to improve the alignment between the alignment device 200 and the target locations 84. The controller 30 may then control the mechanical assembly 250 to perform the alignment corrections and/or to adjust the position and/or orientation of the alignment device 200 with respect to the receiving device (e.g., atomic object confinement apparatus 80) such that the output couplers 232 of the alignment device 200 are properly aligned with the target locations 84 of the receiving device. In various embodiments, the mechanical assembly 250 is operable to modify and/or adjust the positioning of the alignment device 200 with the receiving device (e.g., the atomic object confinement apparatus 80) during operation of the quantum computing system 100, between performance of quantum circuits and/or programs by the quantum computer system 100, and/or the like. For example, the mechanical assembly 250 comprises one or more piezoelectric transducers and/or the like configured to control the position of the alignment device 200 with respect to the position of the atomic object confinement apparatus in one or more degrees of freedom.

In an example embodiment, the mechanical assembly 250 is a piezoelectric ratchet device and/or a piezoelectric inchworm device (e.g., an inchworm motor and/or the like). For example, an electrical signal may be provided to a piezoelectric element of the mechanical assembly 250 that causes an actuator (e.g., possibly the piezoelectric element itself and/or otherwise coupled to the piezoelectric element) to change size and/or length. The change in size and/or length of the actuator causes the adjustment and/or modification of the positioning of the alignment device 200 with the receiving device (e.g., the atomic object confinement apparatus 80). For example, the controller 30 may control one or more voltage sources 50 to provide appropriate electrical signals to the mechanical assembly 250 to cause the mechanical assembly to modify and/or adjust the positioning of the alignment device 200 with the receiving device (e.g., the atomic object confinement apparatus 80) in accordance with the alignment corrections. In an example embodiment, the mechanical assembly 250 is configured to maintain the positioning of the alignment device 200 with respect to the receiving device (e.g., the atomic object confinement apparatus 80) in the absence of an electrical signal configured to modify and/or adjust the positioning of the positioning of the alignment device 200 with respect to the receiving device. In various embodiments, the mechanical assembly 250 is configured to make modifications and/or adjustments to the positioning of the alignment device 200 with respect to the receiving device on a sub-micron (e.g., nanometer) scale.

Example Manufacturing of an Alignment Device

FIG. 5 provides a flowchart illustrating various processes, procedures, operations, and/or the like for manufacturing an alignment device 200, in accordance with an example embodiment. Starting at step/operation 502, an input position array is obtained. In various embodiments, the input position array indicates the relative location of a plurality of inputs 212 such that each of the plurality of inputs 212 is able to be aligned (e.g., with sub-micron precision) with a respective core 67 of a respective optical fiber 66 engaged and/or secured within the coupling element array 68. In various embodiments, the input position array is obtained by a computing entity (e.g., computing entity 10).

For example, FIG. 6 provides a flowchart illustrating various processes, procedures, operations, and/or the like for obtaining an input position array, according to an example embodiment. Starting at step/operation 602, a plurality of optical fibers 66 are engaged with and/or secured into respective coupling elements 62 of the coupling element array 68. For example, epoxy, mechanical fasteners, adhesive, and/or the like may be used to engage and/or secure the optical fibers 66 into respective coupling elements 62 of the coupling element array 68.

At step/operation 604, the core positions of the optical fibers 66 are determined. For example, the positions of the cores 67 with respect to one another and/or with respect to an external reference may be determined. In an example embodiment, optical signals are provided through the optical fibers 66 and the relative and/or absolute locations where the optical signals exit the optical fibers 66 are determined. For example, a CCD sensor and/or the like may be configured to determine the spatial distribution of the optical signals exiting the coupling side 63 of the coupling element array 68. The spatial distribution of the optical signals exiting the coupling side 63 of the coupling element array 68 may then be used to determine the positions of the cores 67 of the optical fibers 66 with respect to one another and/or with respect to a reference point of the coupling element array 68 (e.g., one or more array alignment elements 64 and/or the like).

At step/operation 606, the array of input positions 214 is determined based on the core positions. For example, the array of input positions 214 is determined such that the inputs 212 are positioned so that the inputs are aligned and/or able to be aligned with the core positions. For example, the position of the inputs 212, as indicated by the array of input positions 214 is determined based on the actual, measured core positions of the optical fibers 66 engaged with and/or secured into the coupling element array 68, in an example embodiment.

In an example embodiment, the array of input positions 214 is determined by aligning an un-patterned alignment device with photoresist disposed on at least a portion thereof with the coupling element array 68 having the optical fibers 66 engaged therewith. UV light is then applied through the optical fibers to expose the photoresist to the UV light at the fiber core directions. This results in the array of input locations being directly written to the photoresist on the alignment device.

In an example embodiment, the array of input positions 214 is determined by imaging (e.g., from a top down perspective) the coupling element array 68 having the optical fibers 66 engaged therewith. In an example embodiment, scanning electron microscopy (SEM) of the core 67 positions of the optical fibers 66 engaged in the coupling element array 68 is used to determine the array of input positions 214 based on the determined (relative) locations of the optical fiber cores 67. In various embodiments, imaging of the core 67 positions of the optical fibers 66 engaged in the coupling element array 68 using optimal microscope, an objective and CCD, and/or near field scanning is used to determine the array of input positions 214.

In an example embodiment, the alignment device 200 is configured to correct for the position of the optical fiber cores 67 within the plane of the alignment device (e.g., the xy plane as shown in FIGS. 2A, 2B, and 3). For example, the respective y positions of the array of input positions can be adjusted to account for the location of the optical fiber cores. However, non-concentricity of an optical fiber core 67 with the cladding of the optical fiber that results in an error in the out of plane dimension (e.g., in the z direction as illustrated in FIGS. 2A, 2B, and 3) are more difficult to correct for, in various embodiments. Therefore, in an example embodiment, the out of plane dimension errors are reduced by rotating the optical fibers 66 within the respective coupling element 62 of the coupling element array 68 to minimize and/or reduce the out of plane dimension errors (e.g., z-direction errors). For example, in various embodiments, an optical fiber 66 is rotated so that the positional error of the optical fiber core 67 exists and/or is entirely in the xy plane. The positional error is then easily corrected.

For example, in an example embodiment, step/operation 602 may include temporarily securing the optical fibers 66 into the coupling element array 68. Step/operation 604 may then include correcting the core positional errors in the out-of-plane dimension (e.g., z-direction) by, for example, rotating the non-concentric optical fibers 66 within respective coupling elements 62 of the coupling element array 68. This intermediary process may be performed iteratively to ensure any remaining out-of-plane dimension core positional errors are minimized. The optical fibers 66 may then be permanently secured into the respective coupling elements 62 of the coupling element array 68 and the final core positions of the optical fibers 66 determined. The process may then continue to step/operation 606 and the input position array may be determined based on the final core positions.

The array of input positions 214 is then provided such that the array of input positions 214 is obtained. For example, the array of input positions 214 may be determined by a module, program, or application operating on a computer entity (e.g., similar to computing entity 10) and stored to memory to be read and/or accessed later; provided as input to another module, program, or application operating on the computer entity; or provided (e.g., transmitted) via one or more wired and/or wireless networks such that the array of input positions is received by another computing entity.

Returning to FIG. 5, an output position array is obtained. In various embodiments, the output position array 234 indicates the relative location of a plurality of output couplers 232 such that each of the plurality of output couplers 232 is able to be aligned (e.g., with sub-micron precision) with a respective input waveguide 88 of the atomic object confinement apparatus 80 to optical couple the output coupler 232 to one or more respective target locations 84 of the receiving device (e.g., atomic object confinement apparatus 80). In various embodiments, the output position array is obtained by a computing entity (e.g., computing entity 10).

In an example embodiment, the output position array 234 further indicates one or more output properties that should be imparted to an optical signal exiting a respective output coupler 232. For example, the one or more output properties may indicate polarization, propagation direction, beam size, phase delay, focus location, and/or the like of the outgoing optical signal. For example, an output coupler 232 may have an output optical element (e.g., similar to output optical element 436) positioned at the output 432 and/or near the output along the corresponding waveguide 222 such that the one or more output properties are imparted to the optical signal as the optical signal exits the output coupler 232. The output position array 234 includes information identifying the respective one or more output properties for the respective outputs 234 such that respective output optical elements 436 may be formed and/or disposed in appropriate relationship with the respective output couplers 232 to provide the desired output properties to the outgoing optical signals.

Figure 7:
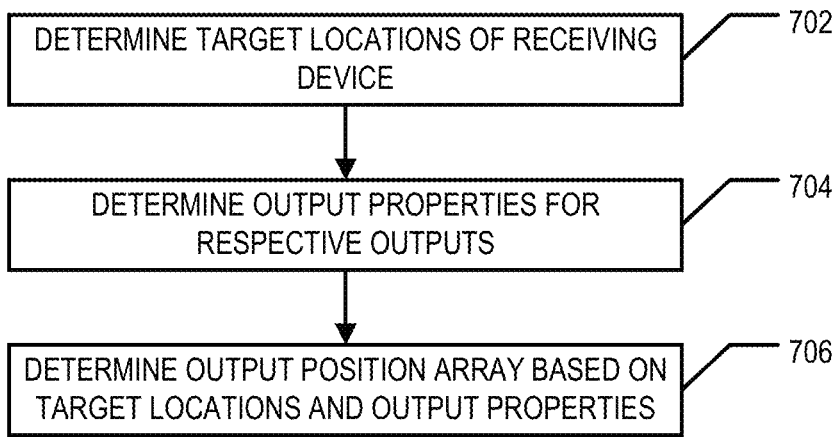
FIG. 7 is a flowchart illustrating various processes, procedures, and/or operations for determining an output position array, according to various embodiments.

FIG. 7 provides a flowchart illustrating various processes, procedures, operations, and/or the like for obtaining an output position array 234, according to an example embodiment. Starting at step/operation 702, the input positions 89 of the input waveguides 88 of the receiving device that are configured to optically couple the output couplers 232 to the target locations 84 of the receiving device are determined. For example, the input positions 89 of the input waveguides 88 of the receiving device that are configured to optically couple the output couplers 232 to the target locations 84 of the receiving device may be determined relative to one another and/or relative to a component (e.g., an alignment arrangement, power monitor 86, and/or the like) of the receiving device.

At step/operation 704, one or more respective output properties for each output coupler 232 are determined. For example, the one or more respective output properties for a respective output coupler 232 may be determined such that an optical signal exiting the respective signal has an appropriate propagation direction to be incident on the corresponding target location 84. For example, the one or more respective output properties for a respective output coupler 232 may be determined such that an optical signal exiting the respective output is focused and/or collimated such that the optical signal will have the desired beam size at the target location 84, desired focus location, and/or the like. For example, the one or more respective output properties for a respective output coupler 232 are determined such that an optical signal exiting the respective output has a desired phase delay and/or desired polarization when the optical signal is incident on the corresponding target location 84. In various embodiments, the one or more output properties for a respective output coupler 232 are determined based on the expected location of the respective output coupler 232 with respect to the target location 84 when the alignment device 200 is secured in relation to the receiving device (e.g., atomic object confinement apparatus 80), the intended use of the optical signal provided to the target location 84 via the respective output coupler 232 (e.g., which function(s) of the quantum computer 110 the optical signal is to be used to perform), and/or the like.

At step/operation 706, the array of output positions 234 is determined based on the positions of the target locations and/or the one or more respective output properties for respective output couplers 232. For example, the array of output positions 234 is determined such that the output couplers 232 are positioned and/or configured to provide output signals exiting therefrom to respective target locations 84 such that the provided output signals have the desired respective output properties.

In an example embodiment, the array of output positions 234 is a standardized array of positions. For example, the array of output positions 234 may comprise standardized positions and standardized pitch so that the output of the alignment device 200 is consistent between different alignment devices 200 and/or so that the alignment devices 200 are interchangeable (e.g., with respect to interfacing with the receiving device). In such embodiments, the array of output positions 234 may be physically defined with ebeam precision.

The array of output positions 234 is then provided such that the array of output positions 234 is obtained. For example, the array of output positions 234 may be determined by a module, program, or application operating on a computer entity (e.g., similar to computing entity 10) and stored to memory to be read and/or accessed later; provided as input to another module, program, or application operating on the computer entity; or provided (e.g., transmitted) via one or more wired and/or wireless networks such that the array of input positions is received by another computing entity.

Returning to FIG. 5, at step/operation 506 one or more waveguide paths are determined. A respective waveguide path of the one or more waveguide paths is configured such that a waveguide fabricated in and/or on the first substrate 220 in accordance with the waveguide path is configured to provide an optical path from a respective input 212 to one or more respective output couplers 232. In various embodiments, the waveguide paths may indicate the topology and/or geometry of the respective waveguide (e.g., from the respective input 212 to the one or more respective output couplers 232), locations and/or characteristics of one or more optical elements (e.g., beam splitters 424, modulators 426, and/or other optical elements) to be located along the respective waveguide 222, and/or the like.

For example, the alignment device 200 may be configured to receive optical signals of multiple wavelengths. For example, the alignment device may receive a first optical signal of a first wavelength. The alignment device 200 may be configured to split the first optical signal into two or more optical signals of the first wavelength and use a modulator along each of the optical paths corresponding to the split instances of the first optical signal to control which output provides a split instance of the first optical signal at a particular moment in time. Thus, determining the waveguide paths for such an embodiment of the alignment device comprises determining the locations of the beam splitters 424 such that the first optical signal is divided into the desired number of split instances of the first optical signal. Determining the waveguide paths for this example embodiment of the alignment device further comprises determining the optical paths the resulting waveguides 222 will use to link the input 212 configured to receive the first optical signal to the respective outputs configured to provide the respective split instances of the first optical signal as output. Determining the waveguide paths for this example embodiment of the alignment device may further comprises determining the location along the optical paths where respective modulators 426 and/or other optical elements should be positioned to control the various split instances of the first optical signal.

At step/operation 508, the alignment device 200 is fabricated. For example, various deposition, epitaxial growth, etching, and/or other fabrication steps may be performed to fabricate the alignment device 200. In various embodiments, the alignment device 200 is fabricated using a lithographic technique to precisely position the inputs 212 in accordance with the array of input positions 214 and the output couplers 232 in accordance with the array of output positions 234. For example, ebeam and/or direct-write lithographical techniques may be used to precisely form the inputs 212 in accordance with the array of input positions 214, the output couplers 232 in accordance with the array of output positions 234, and the waveguides 222 connecting the inputs 212 with one or more respective output couplers 232. In various embodiments, the modulators, beam splitters, and/or the like prescribed by the determined waveguide paths are also formed through appropriate fabrication processes.

In various embodiments, the alignment device 200 is fabricated such that waveguide cores define the inputs 212, waveguides 222, and output couplers 232. In various embodiments, the waveguide cores comprise and/or are made of $Al_2O_3$, $Si_3N_4$, Si, amorphous Si, $TiO_2$, $HfO_2$, and/or the like.

In various embodiments, the waveguide cores are embedded within cladding material. In various embodiments, the cladding material is configured to protect the waveguide cores from the external environment, isolate the waveguide cores form one another, prevent optical leakage from the waveguides 222, and/or the like. In various embodiments, the cladding material comprises and/or is made of $SiO_2$, TEOS $SiO_2$, vacuum, air, and/or the like.

In an example embodiment, the alignment device 200 is fabricated on a first substrate 220. The coupling element array 68 is fabricated and/or formed on a second substrate 61. In an example embodiment, the first substrate and the second substrate are formed of the same material and/or materials that have similar thermal expansion coefficients. In particular, the thermal expansion coefficients of the first substrate and the second substrate are similar such that when the alignment device 200 and the coupling element array 68 are cooled to cryogenic temperatures (e.g., 124 K or below) the alignment between the optical fiber cores 67 of the optical fibers secured into and/or engaged with the coupling element array 68 and the respective inputs 212 still has sub-micron precision.

In various embodiments, the fabrication process includes fabricating and/or securing into place one or more optical elements (e.g., beam splitter 424, modulator 426, output optical element 436, and/or other optical elements) at positions indicated by the waveguide paths and/or the array of output positions.

In various embodiments, manufacturing the alignment device 200 comprises securing the alignment device 200 with respect to the coupling element array 68 to form an alignment assembly 260. In an example embodiment, the alignment device 200 is secured with respect to the coupling element array 68 as part of the alignment/installation process, as part of step/operation 802 of FIG. 8. In an example embodiment where the manufacturing process includes securing the alignment device 200 with respect to the coupling element array 68, the process continues to step/operation 510.

At step/operation 510, the alignment device 200 is aligned with the coupling element array 68. For example, the alignment device 200 is aligned with the coupling element array 68 such that the respective optical fiber cores 67 are aligned with the respective inputs 212 with sub-micron (e.g., 10 to 500 nm) precision. For example, the array alignment element 64 may be engaged with, mated, and/or the like with the device coupling element 240 to cause the alignment device 200 to be aligned with the coupling element array 68.

In an example embodiment, respective optical signals are provided to two or more optical fibers 66 secured into and/or engaged with the coupling element array 68 and the output powers of corresponding output optical signals (e.g., exiting the alignment device 200 via respective output couplers 232) are monitored while the respective positioning of the alignment device 200 and the coupling element array 68 are modified in one to six degrees of freedom until the output powers are maximized, optimized, greater than a combined threshold and/or respective thresholds, and/or the like.

At step/operation 512, once the alignment device 200 is aligned with the coupling element array 68, the alignment device 200 is secured with respect to the alignment device 200. For example, an epoxy process may be performed to secure the alignment device 200 into position with respect to the coupling element array 68. In various embodiments, various techniques may be used to permanently couple the alignment device 200 into sub-micron alignment with the coupling element array 68. For example, the alignment device 200 and the coupling element array 68 are secured to one another, in an example embodiment, possibly with or without air/vacuum space between the optical fiber cores 67 and the respective inputs 212.

Example Aligning of an Alignment Device with a Receiving Device

Figure 8:
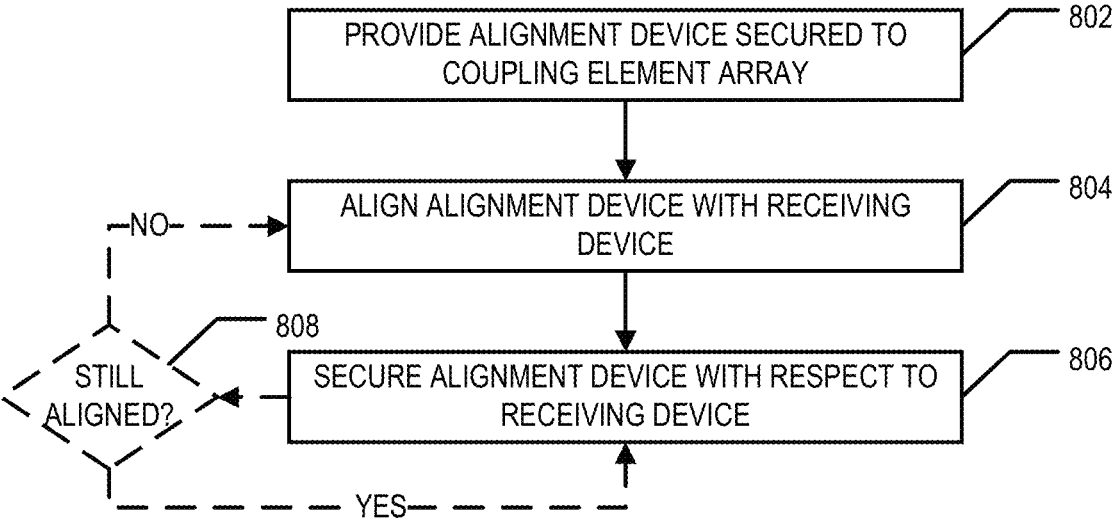
FIG. 8 is a flowchart illustrating various processes, procedures, and/or operations of using an alignment device to provide optical signals to target locations of a receiving device, according to an example embodiment.

FIG. 8 is a flowchart illustrating various processes, procedures, operations, and/or the like for aligning an alignment device with a receiving device and/or installing an alignment device. Starting at step/operation 802, an alignment device 200 is provided. In various embodiments, the alignment device comprises a substrate having at least one input side and at least one output side. The input side comprises one or more inputs that were fabricated in accordance with an array of input elements that was determined based at least in part on the positions of optical fiber cores 67 of optical fibers 66 secured into and/or engaged with a coupling element array 68 configured for use with the alignment device 200. The output side comprises a plurality of output couplers that were fabricated in accordance with an array of output positions that was determined based at least in part on the positions of one or more target locations, input positions of one or more input waveguides of the receiving device (e.g., atomic object confinement apparatus 80), and/or a standardized array of output positions and/or desired output properties for respective outputs. The alignment device further comprises waveguides 222 and possibly optical elements (e.g., beam splitter 424, modulator 426, output optical element 436, and/or other optical elements) that are configured to optically connect the inputs to respective outputs.

In an example embodiment, the alignment device 200 is secured into position with respect to a coupling element array 68 as part of the manufacturing process. In an example embodiment, the alignment device 200 is received uncoupled from the coupling element array and is then secured into position with respect to the coupling element array. For example, in an example embodiment, step/operation 802 includes steps/operations 510 and 512 of FIG. 5. For example, the alignment device 200 may be received as part of an alignment assembly 260 or the alignment device 200 may be secured to the coupling element array 68 to form an alignment assembly 260.

At step/operation 804, the alignment device is aligned with the receiving device. For example, the alignment device 200 may be aligned with the receiving device such that optical signals exiting the output couplers 232 of the alignment device are incident on input positions of input waveguides of the receiving device configured to provide the respective optical signals to respective target locations 84 of the receiving device. For example, in an example embodiment, one or more power monitors 86 may be disposed on the receiving device (e.g., the atomic object confinement apparatus 80). In an example embodiment, a power monitor 86 may be positioned along the optical path between an output coupler 232 and a corresponding target location 84 and configured to pick off a portion of an optical signal being provided to the corresponding target location 84 to measure an intensity and/or power provided by the optical signal. In an example embodiment, the alignment device 200 comprises an output coupler 232 dedicated to providing a signal to the power monitor 86 (e.g., the power monitor 86 is the target location 84 corresponding to the output coupler 232). In an example embodiment, the one or more power monitors 86 are in electrical communication with the controller 30 via wired connections 87. In an example embodiment, an alignment arrangement, an example of which is described in U.S. application Ser. No. 17/653,979, filed Mar. 8, 2022, the content of which is incorporated herein by reference in its entirety, may be used to aid in the alignment of the alignment device 200 with the receiving device. In an example embodiment, a loopback waveguide (e.g., located at the edge of the alignment device 200 and the atomic object confinement apparatus 80) are used to optically confirm that the alignment device 200 and the atomic object confinement apparatus 80 are (globally) aligned.

For example, at least one alignment criteria may be used to determine whether the alignment device 200 is aligned with the receiving device. For example, the alignment criteria may be determine based on signals generated by one or more power monitors, by optical detectors associated with an alignment arrangement, and/or the like. For example, the alignment criteria may be one or more thresholds configured to aid in the determination of when the alignment device is appropriately aligned with the input positions of input waveguides of the receiving device configured to provide the respective optical signals to target locations of the receiving device.

At step/operation 806, once it is determined that the alignment device is aligned with the receiving device, the alignment device 200 is secured into position with respect to the receiving device. For example, the alignment device 200 may be secured into position with respect to the receiving device. In various embodiments, the alignment device 200 is not directly physically coupled to the receiving device. For example, an air gap of up to 10 microns may exist between the alignment device 200 and the receiving device and/or one or more input positions of input waveguides of the receiving device configured to provide the respective optical signals to target locations of the receiving device when the alignment device 200 is secured into position with respect to the receiving device.

In various embodiments, the alignment device is mounted to a mechanical assembly 250. The mechanical assembly enables sub-micron scale control over the position of the alignment device in multiple degrees of freedom (e.g., in the x-direction, y-direction, z-direction, rotation about the x-axis, and/or tilt with respect to the yz-plane, as illustrated in FIGS. 2A, 2B, and 3). In an example embodiment, at one or more points during the thermal cycling process and/or after completion of the thermal cycling process, the alignment of the alignment device 200 (e.g., the output couplers 232) with the input positions of input waveguides of the receiving device configured to provide the respective optical signals to target locations 84 of the receiving device (e.g., the atomic object confinement apparatus 80) is checked at step/operation 808. For example, the alignment of the alignment device 200 and the receiving device may be checked to determine whether the alignment of the alignment device and the receiving device still satisfies the alignment criteria. When the alignment criteria is still satisfied, no alignment correction is required. However, when the alignment criteria is not still satisfied, the controller 30 causes an alignment correction to be performed.

For example, one or more power monitors 86 of the receiving device (e.g., atomic object confinement apparatus 80) provide signals corresponding to observed optical power levels to the controller 30. In another example, one more optical signals are incident on an alignment arrangement and the resulting optical signals are captured by one or more optical detectors and corresponding signals are provided to the controller 30. The controller 30 may then determine whether the alignment device 200 is still aligned with the receiving device or if the position of the alignment device with respect to the receiving device needs to be modified and/or adjusted in one or more degrees of freedom. For example, the controller 30 may determine an alignment correction, when it is determined that the alignment device is not appropriately aligned with the receiving device. The controller 30 may then control the mechanical assembly 250 to adjust the position of the alignment device with respect to the receiving device in accordance with the alignment correction.

In an example embodiment, an alignment check is triggered at various points through the thermal cycling of the cryostat and/or vacuum chamber 40, before starting to perform a quantum circuit and/or program, at one or more points during performing a quantum circuit and/or program, and/or the like. Thus, various embodiments are configured to ensure that the sub-micron (e.g., 10 to 500 nm) precision is maintained along the optical paths from the optical fibers 66 carrying optical signals generated by the manipulation sources 60 to the target locations 84 of the receiving device.

Technical Advantages

Example embodiments provide high precision photonic alignment devices, systems incorporating photonic alignment devices, methods of manufacturing photonic alignment devices, and/or methods of use of photonic alignment devices. In various embodiments, the photonic alignment devices are configured to enable alignment of a plurality of optical fibers with respective target locations of a receiving device with precision within the range of 10 to 500 nm. In various embodiments, the plurality of optical fibers are secured into a coupling element array, such as a v-groove array and/or the like. The photonic alignment device is configured (e.g., designed and fabricated) to provide high precision alignment between the plurality of optical fibers secured into the coupling element array and the target locations of the receiving device.

Conventionally, v-groove arrays are used to optically couple optical fibers to receiving devices. Such configurations result in alignment errors on the order of a micron or more. While such alignment errors may not substantially degrade performance at longer wavelengths (e.g., infrared wavelengths or longer), such alignment errors are detrimental at visible and UV wavelengths. For example, visible and UV wavelengths have lower coupling efficiency due to the generally smaller mode field diameters of the shorter wavelength light. Moreover, for cryogenic and/or in-cryostat applications, shifts in alignment positioning during the thermal cycling of the system to reduce the system to cryogenic temperatures can cause further alignment errors. To overcome such alignment errors, higher levels of optical power are often used, resulting in unwanted heating within the cryostat and reduced lifetime due to fiber and waveguide degradation.

In an attempt to reduce the excess optical power required to be delivered to the system (which leads to excess system heating), silicon v-groove arrays which offer microscopic fiber alignment with matched coefficients of thermal expansion are used to mitigate these high edge coupling losses. Despite the v-groove precision, core/cladding concentricity of the optical fibers is still limited and results in typical errors of the core pitch and vertical position (e.g., typically −1 μm). While acceptable at longer wavelengths (e.g., infrared), this results in significant input coupling loss at the visible/UV wavelengths. Additionally, the fiber pitch on these v-groove arrays is at best >100 μm which quickly consumes chip edge-space. This limits the number of fibers that can be coupled to the chip (a significant challenge as future devices are scaled up to double- or triple-digit fiber count) and competes with wire-bond space needed for scaling up the number of electrodes on the chip.

Moreover, to mitigate thermal drift during bake-out and cryogenic pumping, these v-groove arrays must also be epoxied to the photonic integrated circuits (PICs) for maintaining alignment. This poses a significant challenge when scaling towards commercial operation. Optical fiber alignment takes considerable technician time (especially as the number of fibers grows into double digits) and requires active alignment during the entire curing process. Any misalignment or re-working of the optical fibers will require both the fiber array and the entire PIC assembly to be disposed of—starting the entire process over. Likewise, if alignment shifts during thermal cycling, again the entire PIC assembly and v-groove array must be disposed, resulting in a trial by error down selection of cherry-picking the PIC-v-groove assembly that successfully remains aligned through the entire thermal cycle. Further, under commercial operation the system is expected to run for multiple months at a minimum. With the fiber v-groove array epoxied to the PIC assembly, fiber lifetime will likely be limited and replaceability will again require the entire PIC assembly to be disposed of and the down-selection process repeated. These issues only get exacerbated as the number of fibers required increases and thus significant technician and engineer time and waste of PIC assembly are expected.

Thus, significant problems exist regarding the alignment of optical fibers being coupled to PIC assemblies. These problems are particularly salient in systems using visible and/or UV wavelength optical signals and systems where the PIC assembly is operated within a cryostat and/or at reduced temperatures (reduced with respect to ambient and/or room temperature, for example) and/or in high vacuum compatible environments.

Various embodiments provide technical solutions to these technical problems regarding the alignment of optical fibers coupled to PIC assemblies. In various embodiments, an alignment device is provided that is configured to receive respective optical signals from an array of optical fibers that are secured within a coupling element array. For example, an array of input positions for the alignment device is determined based on the actual core positions of the array of optical fibers that are secured within the coupling element array. The alignment device is configured to provide respective optical signals to respective target locations of a receiving device (e.g., the PIC assembly). For example, the array of output positions for the alignment device is determined based on the actual target location positions of the receiving device. The alignment device may then be secured into alignment with respect to the array of coupling elements and the optical fiber array. For example, an epoxying process may be used to secure the alignment device into an appropriate alignment with the array of coupling elements. A mechanical alignment assembly may be used to provide sub-micron positional control of the alignment device such that any positional and/or alignment changes during thermal cycling can be corrected to provide proper alignment of the alignment device to the PIC assembly during system operation.

Moreover, when an optical fiber needs to be replaced, only the alignment device and the coupling element array need to be replaced along with the array of optical fibers. In other words, the PIC assembly need not be replaced and/or removed from the cryostat. As the alignment device is a substantially simpler device than the PIC assembly, the time and resources required for fabricating a new alignment device are low compared to fabricating a new PIC assembly. Furthermore, in various embodiments the PIC assembly is required to be installed within the cryostat in a particular manner (e.g., level to within a very small error, etc.). Being able to leave the PIC assembly in position within the cryostat and replacing the alignment device enables shorter downtime for the system when dealing with burnt out optical fibers and/or the like. For example, in an example embodiment, the alignment device is a photonic fuse that acts as a comparatively easily replaced component configured to acts as an intermediary between the receiving device (e.g., atomic object confinement apparatus) and the high-powered manipulation sources (e.g., lasers).

Various embodiments, therefore, various embodiments provide significant advantages over traditional techniques for providing optical signals to a PIC assembly.

Exemplary Controller

In various embodiments, an atomic object confinement apparatus 80 is incorporated into a system (e.g., a quantum computer 110) comprising a controller 30. In various embodiments, the controller 30 is configured to control various elements of the system (e.g., quantum computer 110). For example, the controller 30 may be configured to control the voltage sources 50, a cryostat system and/or vacuum system controlling the temperature and pressure within the cryostat and/or vacuum chamber 40, manipulation sources 60, mechanical assembly 250, cooling system, and/or other systems controlling the environmental conditions (e.g., temperature, humidity, pressure, and/or the like) within the cryostat and/or vacuum chamber 40 and/or configured to manipulate and/or cause a controlled evolution of quantum states of one or more atomic objects confined by the atomic object confinement apparatus 80. In various embodiments, the controller 30 may be configured to receive signals from one or more optics collection systems.

As shown in FIG. 9, in various embodiments, the controller 30 may comprise various controller elements including processing elements 905, memory 910, driver controller elements 915, a communication interface 920, analog-digital converter elements 925, and/or the like. For example, the processing elements 905 may comprise programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, and/or the like. and/or controllers. The term circuitry may refer to an entirely hardware embodiment or a combination of hardware and computer program products. In an example embodiment, the processing element 905 of the controller 30 comprises a clock and/or is in communication with a clock.

For example, the memory 910 may comprise non-transitory memory such as volatile and/or non-volatile memory storage such as one or more of as hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. In various embodiments, the memory 910 may store a queue of commands to be executed to cause a quantum algorithm and/or circuit to be executed (e.g., an executable queue), qubit records corresponding the qubits of quantum computer (e.g., in a qubit record data store, qubit record database, qubit record table, and/or the like), a calibration table, computer program code (e.g., in a one or more computer languages, specialized controller language(s), and/or the like), and/or the like. In an example embodiment, execution of at least a portion of the computer program code stored in the memory 910 (e.g., by a processing element 905) causes the controller 30 to perform one or more steps, operations, processes, procedures and/or the like described herein for providing manipulation signals to atomic object positions and/or collecting, detecting, capturing, and/or measuring indications of emitted signals emitted by atomic objects located at corresponding atomic object positions of the atomic object confinement apparatus 300.

In various embodiments, the driver controller elements 915 may include one or more drivers and/or controller elements each configured to control one or more drivers. In various embodiments, the driver controller elements 915 may comprise drivers and/or driver controllers. For example, the driver controllers may be configured to cause one or more corresponding drivers to be operated in accordance with executable instructions, commands, and/or the like scheduled and executed by the controller 30 (e.g., by the processing element 905). In various embodiments, the driver controller elements 915 may enable the controller 30 to operate a voltage sources 50, manipulation sources 60, cooling system, and/or the like. In various embodiments, the drivers may be laser drivers configured to operate one or more manipulation sources 60 to generate manipulation signals; vacuum component drivers; drivers for controlling the flow of current and/or voltage applied to electrodes used for maintaining and/or controlling the trapping potential of the atomic object confinement apparatus 80 (and/or other drivers for providing driver action sequences to potential generating elements of the atomic object confinement apparatus); cryostat and/or vacuum system component drivers; mechanical system 250 drivers; cooling system drivers; and/or the like. In various embodiments, the controller 30 comprises means for communicating and/or receiving signals from one or more optical receiver components (e.g., photodetectors of the optics collection system). For example, the controller 30 may comprise one or more analog-digital converter elements 925 configured to receive signals from one or more optical receiver components (e.g., a photodetector of the optics collection system), calibration sensors, and/or the like.

In various embodiments, the controller 30 may comprise a communication interface 920 for interfacing and/or communicating with a computing entity 10. For example, the controller 30 may comprise a communication interface 920 for receiving executable instructions, command sets, and/or the like from the computing entity 10 and providing output received from the quantum computer 110 (e.g., from an optical collection system) and/or the result of a processing the output to the computing entity 10. In various embodiments, the computing entity 10 and the controller 30 may communicate via a direct wired and/or wireless connection and/or via one or more wired and/or wireless networks 20.

Exemplary Computing Entity

FIG. 10 provides an illustrative schematic representative of an example computing entity 10 that can be used in conjunction with embodiments of the present invention. In various embodiments, a computing entity 10 is configured to allow a user to provide input to the quantum computer 110 (e.g., via a user interface of the computing entity 10) and receive, display, analyze, and/or the like output from the quantum computer 110.

As shown in FIG. 10, a computing entity 10 can include an antenna 1012, a transmitter 1004 (e.g., radio), a receiver 1006 (e.g., radio), and a processing element 1008 that provides signals to and receives signals from the transmitter 1004 and receiver 1006, respectively. The signals provided to and received from the transmitter 1004 and the receiver 1006, respectively, may include signaling information/data in accordance with an air interface standard of applicable wireless systems to communicate with various entities, such as a controller 30, other computing entities 10, and/or the like. In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The computing entity 10 can also download changes, add-ons, and updates, for instance, to its firmware, software (e.g., including executable instructions, applications, program modules), and operating system.

In various embodiments, the computing entity 10 may comprise a network interface 1020 for interfacing and/or communicating with the controller 30, for example. For example, the computing entity 10 may comprise a network interface 1020 for providing executable instructions, command sets, and/or the like for receipt by the controller 30 and/or receiving output and/or the result of a processing the output provided by the quantum computer 110. In various embodiments, the computing entity 10 and the controller 30 may communicate via a direct wired and/or wireless connection and/or via one or more wired and/or wireless networks 20.

The computing entity 10 may also comprise a user interface device comprising one or more user input/output interfaces (e.g., a display 1016 and/or speaker/speaker driver coupled to a processing element 1008 and a touch screen, keyboard, mouse, and/or microphone coupled to a processing element 1008). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 1018 (hard or soft), a touch display, voice/speech or motion interfaces, scanners, readers, or other input device. In embodiments including a keypad 1018, the keypad 1018 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 1022 and/or non-volatile storage or memory 1024, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SWIM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

CONCLUSION

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for manufacturing an alignment device, the method comprising:
   obtaining an input position array by measuring a position of a core of each of a plurality of optical fibers secured to respective coupling elements of a coupling element array, wherein, each of the plurality of optical fibers is associated with a respective input of a plurality of inputs of the alignment device such that the input position array indicates relative positions of the plurality of inputs of the alignment device;
   obtaining an output position array based at least in part on a plurality of target locations of a receiving device;
   determining one or more waveguide paths, each waveguide path configured to provide an optical path between one or more respective input positions of the input position array to one or more respective output positions of the output position array; and
   fabricating, based on the input position array, the output position array, and the one or more waveguide paths, the alignment device, wherein the alignment device comprises a substrate comprising a plurality of inputs at respective input positions corresponding to the input position array, a plurality of outputs at respective output positions corresponding to the output position array, and one or more waveguides corresponding to the one or more waveguide paths.

2. The method of claim 1, wherein fabricating the alignment device comprises using a lithographic technique to form at least one of the plurality of inputs, the plurality of outputs, or the one or more waveguides.

3. The method of claim 2, wherein the lithographic technique is one of an ebeam lithographic technique or a direct-write lithographic technique.

4. The method of claim 1, further comprising aligning the alignment device with the coupling element array based at least in part on at least one array alignment element of the coupling element array and at least one device alignment element of the alignment device and securing the alignment device into position with respect to the coupling element array.

5. The method of claim 1, wherein the output position array is determined based at least in part on a determination of the target locations of the receiving device.

6. The method of claim 5, wherein the output position is determined based at least in part on one or more output properties associated with respective outputs of the plurality of outputs.

7. The method of claim 1, further comprising fabricating or positioning one or more optical elements along at least one of the one or more waveguides and/or at least one output of the plurality of outputs.

* * * * *